(12) United States Patent
Qian et al.

(10) Patent No.: US 10,988,376 B2
(45) Date of Patent: Apr. 27, 2021

(54) MONOLITHIC INTEGRATION OF PIEZOELECTRIC MICROMACHINED ULTRASONIC TRANSDUCERS AND CMOS AND METHOD FOR PRODUCING THE SAME

(71) Applicant: VANGUARD INTERNATIONAL SEMICONDUCTOR SINGAPORE PTE. LTD., Singapore (SG)

(72) Inventors: You Qian, Singapore (SG); Humberto Campanella-Pineda, Singapore (SG); Rakesh Kumar, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 618 days.

(21) Appl. No.: 15/840,881

(22) Filed: Dec. 13, 2017

(65) Prior Publication Data
US 2019/0177160 A1 Jun. 13, 2019

(51) Int. Cl.
*B81C 1/00* (2006.01)
*B81B 3/00* (2006.01)
(Continued)

(52) U.S. Cl.
CPC ........... *B81C 1/00246* (2013.01); *B06B 1/06* (2013.01); *B81B 3/0021* (2013.01); *H01L 27/20* (2013.01);
(Continued)

(58) Field of Classification Search
CPC ........ B81C 1/00246; B81C 2203/0771; H01L 41/0475; H01L 41/29; H01L 41/314;
(Continued)

(56) References Cited

U.S. PATENT DOCUMENTS 9,646,874 B1 * 5/2017 Wojciechowski .. H01L 21/3213
2010/0314668 A1 * 12/2010 Ollier .................. B81C 1/00246
257/252
(Continued)

OTHER PUBLICATIONS

Akhbari et al., "Bimorph Piezoelectric Micromachined Ultrasonic Transducers", Published in Journal of Microelectromechanical Systems,vol. 25, Issue: 2, Apr. 2016, IEEE, retrieved on Oct. 10, 2017 from "http://ieeexplore.ieee.org/abstract/document/7384687/", pp. 326-336.
(Continued)

*Primary Examiner* — Bryan P Gordon
(74) *Attorney, Agent, or Firm* — Winston Hsu

(57) ABSTRACT

A method of forming a monolithic integrated PMUT and CMOS with a coplanar elastic, sealing, and passivation layer in a single step without bonding and the resulting device are provided. Embodiments include providing a CMOS wafer with a metal layer; forming a dielectric over the CMOS; forming a sacrificial structure in a portion of the dielectric; forming a bottom electrode; forming a piezoelectric layer over the CMOS; forming a top electrode over portions of the bottom electrode and piezoelectric layer; forming a via through the top electrode down to the bottom electrode and a second via down to the metal layer through the top electrode; forming a second metal layer over and along sidewalls of the first and second via; removing the sacrificial structure, an open cavity formed; and forming a dielectric layer over a portion of the CMOS, the open cavity sealed and an elastic layer and passivation formed.

8 Claims, 14 Drawing Sheets

(51) Int. Cl.
  *B06B 1/06* (2006.01)
  *H01L 41/047* (2006.01)
  *H01L 41/29* (2013.01)
  *H01L 41/314* (2013.01)
  *H01L 27/20* (2006.01)
  *H01L 41/053* (2006.01)
  *H01L 41/39* (2013.01)
  *H01L 41/187* (2006.01)

(52) U.S. Cl.
  CPC .......... *H01L 41/0475* (2013.01); *H01L 41/29* (2013.01); *H01L 41/314* (2013.01); *B81B 2201/0271* (2013.01); *B81B 2201/032* (2013.01); *B81B 2207/015* (2013.01); *B81B 2207/096* (2013.01); *B81B 2207/115* (2013.01); *B81C 2201/0105* (2013.01); *B81C 2203/0735* (2013.01); *B81C 2203/0771* (2013.01); *H01L 41/0533* (2013.01); *H01L 41/187* (2013.01); *H01L 41/39* (2013.01)

(58) Field of Classification Search
  CPC ... H01L 41/0533; H01L 41/39; B81B 3/0021; B81B 2207/096
  See application file for complete search history.

(56) References Cited

U.S. PATENT DOCUMENTS

| | | | |
|---|---|---|---|
| 2011/0057288 A1* | 3/2011 | Tan | B81C 1/00246 257/503 |
| 2012/0319174 A1* | 12/2012 | Wang | H04R 19/005 257/254 |
| 2014/0162392 A1* | 6/2014 | Ollier | H01L 27/1203 438/50 |
| 2015/0210540 A1* | 7/2015 | Sadaka | B81C 1/00238 257/414 |
| 2015/0357375 A1* | 12/2015 | Tsai | G06K 9/00006 257/416 |
| 2016/0117541 A1 | 4/2016 | Lu et al. | |
| 2016/0236932 A1* | 8/2016 | Chau | B81C 1/00246 |
| 2016/0262725 A1 | 9/2016 | Boser et al. | |
| 2017/0110504 A1 | 4/2017 | Panchawagh et al. | |
| 2017/0245035 A1* | 8/2017 | Lee | H04R 19/005 |

OTHER PUBLICATIONS

Jiang et al., "Inter-Element Coupling Effects in Pulse-Echo Ultrasonic Fingerprint Sensors", Published in Micro Electro Mechanical Systems (MEMS), IEEE 30th International Conference Jan. 22-26, 2017, retrieved on Oct. 10, 2017, from "http://ieeexplore.ieee.org/document/7863629/", pp. 1192-1195.

Horsley et al., "Ultrasonic fingerprint sensor based on a PMUT array bonded to CMOS circuitry", Published in 2016 IEEE International Ultrasonics Symposium Proceedings, retrieved on Oct. 10, 2017, from "http://ieeexplore.ieee.org/document/7728817/", 4 pages.

Soon et al., "Hermetic Wafer Level Thin Film Packaging for MEMS", Published in "2016 IEEE 66th Electronic Components and Technology Conference", retrieved on Oct. 10, 2017, from "http://ieeexplore.ieee.org/document/7545528/", pp. 857-862.

\* cited by examiner

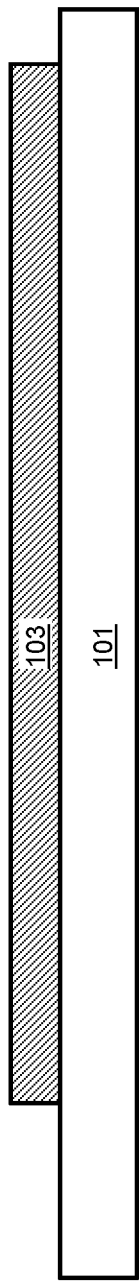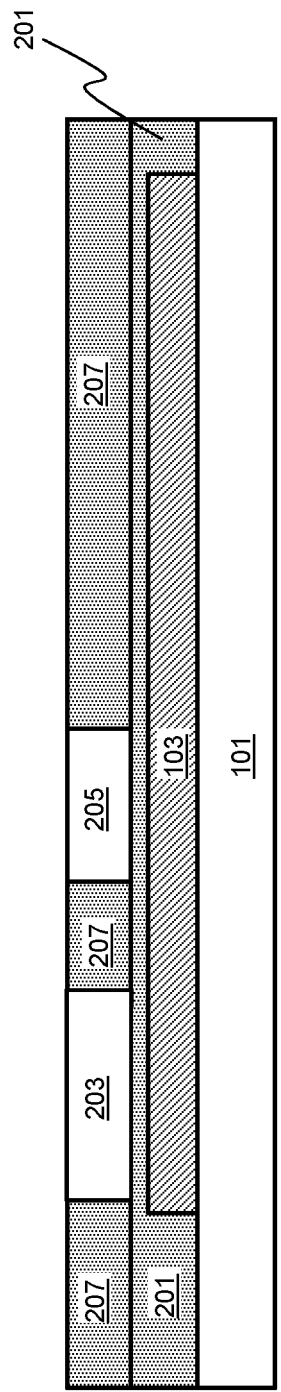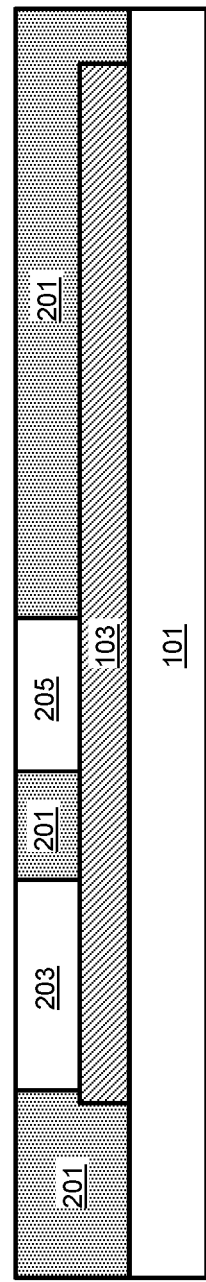

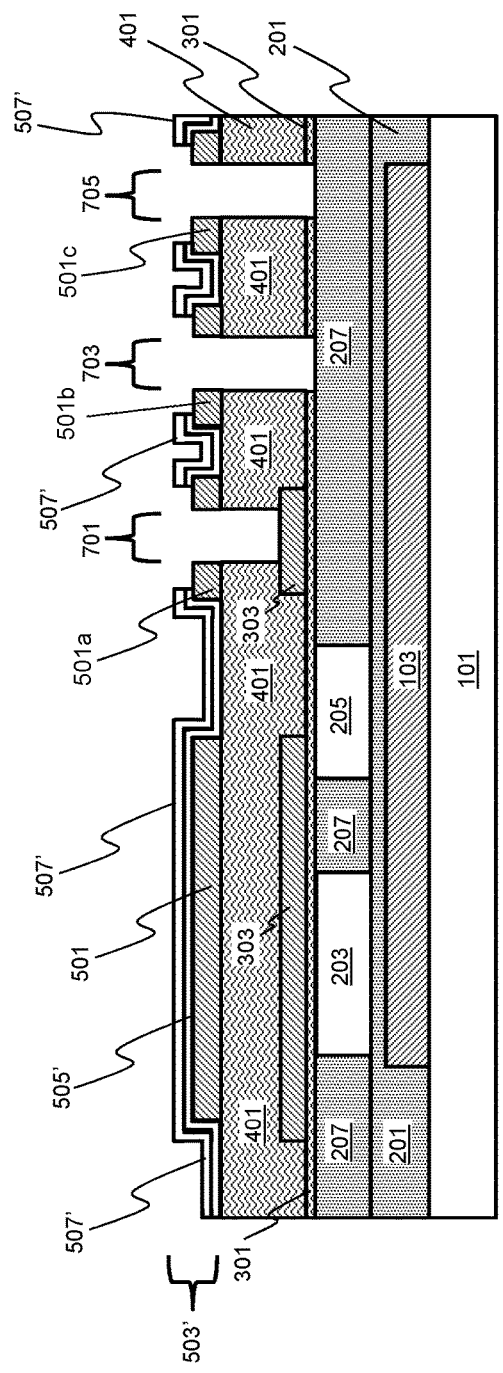
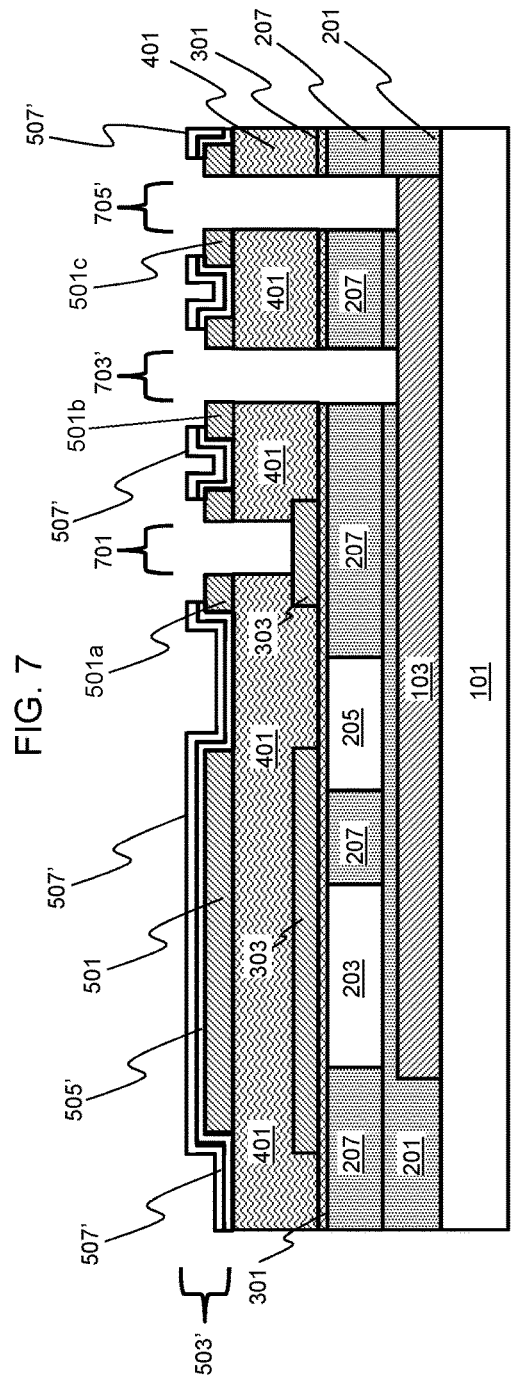
FIG. 7
FIG. 8

US 10,988,376 B2

MONOLITHIC INTEGRATION OF PIEZOELECTRIC MICROMACHINED ULTRASONIC TRANSDUCERS AND CMOS AND METHOD FOR PRODUCING THE SAME

TECHNICAL FIELD

The present disclosure relates to semiconductor fabrication. In particular, the present disclosure relates to the formation of micro-electro-mechanical systems (MEMS) on a semiconductor wafer.

BACKGROUND

A piezoelectric micromachined ultrasonic transducer (PMUT) may be used in nondestructive testing, medical imaging, fingerprint scanning, and the like. Fingerprint mobile applications need high frequency PMUT (HF PMUT). HF MPUT need precise control of phase signal loss. Current developments in this area have focused on wafer bonding, which introduces additional cost, bonding yield, and complex interconnect design factors into the fabrication process. Known monolithic HF PMUT plus integrated circuit (IC) devices have complex process flows for forming the required elastic, sealing, and passivation layers.

A need therefore exists for methodology for forming a monolithic integrated PMUT and CMOS using a relatively simpler and reduced-cost flow, and the resulting device.

SUMMARY

An aspect of the present disclosure is method of forming a monolithic integrated PMUT and CMOS with a coplanar elastic, sealing, and passivation layer formed in a single step without wafer bonding.

Another aspect of the present disclosure is a device including a monolithic PMUT and signal processing integrated circuit with a coplanar elastic, sealing, and passivation layer.

A further aspect of the present disclosure is a device including a monolithic stand-alone PMUT with a coplanar elastic, sealing, and passivation layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a CMOS wafer with a metal layer; forming a dielectric layer over the CMOS wafer; forming a sacrificial structure in a portion of the dielectric layer over the metal layer; forming a bottom electrode over portions of the sacrificial layer and the dielectric layer; forming a piezoelectric layer over the CMOS wafer; forming a top electrode over portions of the bottom electrode and the piezoelectric layer; forming a first via through a first portion of the top electrode down to a portion of the bottom electrode laterally separated from the sacrificial structure and a second via down to the metal layer through a second portion of the top electrode proximate to the first portion; forming a second metal layer over and along sidewalls of the first via and the second via and over a portion of the first portion and the second portion of the top electrode; removing the sacrificial structure, an open cavity formed; and forming a second dielectric layer over a portion of the CMOS wafer, the open cavity sealed and an elastic layer and passivation formed.

Aspects of the present disclosure include forming the dielectric layer and the sacrificial structure by: forming a first dielectric layer over the CMOS wafer; forming a sacrificial layer over the first dielectric layer; patterning the sacrificial layer, the sacrificial structure formed; forming a third dielectric layer over the CMOS wafer; and planarizing the third dielectric layer down to the sacrificial structure, wherein the first dielectric layer and the third dielectric layer comprise the dielectric layer. Other aspects include forming the dielectric layer and the sacrificial structure by: forming the dielectric layer over the CMOS wafer; removing a portion of the dielectric layer down to the metal layer, a trench formed; forming a sacrificial layer over the CMOS wafer, filling the trench entirely; and planarizing the sacrificial layer down to the dielectric layer, the sacrificial structure formed. Further aspects include forming the bottom electrode by: forming a seeding layer over the CMOS wafer; forming a third metal layer over the seeding layer; and patterning the third metal layer. Other aspects include forming the bottom electrode by: forming a third metal layer over respective portions of the dielectric layer and the sacrificial structure; and patterning the third metal layer. Another aspect includes forming the top electrode by: forming a fourth metal layer over the piezoelectric layer; and patterning the fourth metal layer. Other aspects include forming a protection layer over the CMOS wafer and along sidewalls of the top electrode; and removing a portion of the protection layer down to the top electrode prior to forming the first via and the second via, wherein the second metal layer is formed along sidewalls of the protection layer adjacent to the first via and the second via. Further aspects include removing the sacrificial structure by: forming a release via through the protection layer and the piezoelectric layer down to the sacrificial structure; and performing a dry or wet release etch process. Another aspect includes forming a third via through a third portion of the top electrode down to the metal layer, the third portion on an opposite side of the second portion from the first portion; removing the portion of the protection layer prior to forming the third via; forming the second metal layer over and along sidewalls of the third via and along sidewalls of the protection layer adjacent to the third via; forming a fourth dielectric layer over a remaining portion of the CMOS wafer; and forming a trench over the third via through the third dielectric layer down to the second metal layer, an opened pad formed, wherein the second via and the third via are formed as PMUT-application specific integrated circuit (ASIC) electrode vias.

Additional aspects include providing the CMOS wafer with a metal through silicon via (TSV), the metal TSV laterally separated from the metal layer and remote from the cavity; forming a third via over the metal TSV through a third portion of the top electrode down to the metal TSV; removing the portion of the protection layer prior to forming the third via; forming the second metal layer over and along sidewalls of the third via and along sidewalls of the protection layer adjacent to the third via; forming an under bump metallization (UBM) layer under the metal TSV and a portion of the CMOS wafer; forming a fourth dielectric layer over a remaining portion of the CMOS wafer; and forming a coupling layer over the second dielectric layer and the fourth dielectric layer. Other aspects include forming a third metal layer over a third portion of the top electrode, the third portion on an opposite side of the second portion from the first portion; forming a fourth dielectric layer over a remaining portion of the CMOS wafer; forming a trench through the fourth dielectric layer down to the third metal layer; forming a TSV through the CMOS wafer, the dielectric layer, the piezoelectric layer, and the third portion of the top electrode; forming an UBM layer under the metal TSV and a portion of the CMOS wafer; and forming a coupling layer over the second dielectric layer and the fourth dielectric layer.

Another aspect of the present disclosure is a device including: a metal layer over a portion of a CMOS wafer; a first dielectric layer over a portion of the CMOS wafer; a cavity in a portion of the first dielectric layer over the metal layer; a bottom electrode over respective portions of the first dielectric layer and the cavity; a piezoelectric layer over a portion of the cavity and the CMOS wafer, a gap formed over a remaining portion of the cavity; a top electrode over a portion of the piezoelectric layer; a protection layer over the piezoelectric layer and a portion of the top electrode and along sidewalls of the top electrode; a first via through the piezoelectric layer and a first portion of the top electrode down to a portion of the bottom electrode laterally separated from the cavity; a second via through the piezoelectric layer, the dielectric layer, and a second portion of the top electrode proximate to the first portion down to the metal layer; a second metal layer over and along sidewalls of the first via and the second via, over portions of the first portion of the top electrode and the second portion of the top electrode, and along sidewalls of the protection layer adjacent to the first via and the second via; and a second dielectric layer over a portion of the CMOS wafer, the cavity, an elastic layer, and passivation formed.

Aspects of the device include a seeding layer over a portion of the cavity and the CMOS wafer, the seeding layer formed over the respective portions of the first dielectric layer and the cavity and under the bottom electrode and the piezoelectric layer. Additional aspects include a third dielectric layer over a remaining portion of the CMOS wafer. Other aspects include a third via through the piezoelectric layer, the first dielectric layer, and a third portion of the top electrode, down to the metal layer, the third via on an opposite side of the second via from the first via; the second metal layer over and along sidewalls of the third via, over portions of the third portion of the top electrode, and along sidewalls of the protection layer adjacent to the third via; and a third dielectric layer over a portion of the CMOS wafer laterally separated from the second dielectric layer, an open pad formed, wherein the second via and the third via comprise PMUT-ASIC electrode vias. Additional aspects include a metal TSV through the CMOS wafer, the metal TSV laterally separated from the metal layer; a third via through the piezoelectric layer, the first dielectric layer, and a third portion of the top electrode down to the metal TSV, the third via on an opposite side of the second via from the first via; the second metal layer over and along sidewalls of the third via, over portions of the third portion of the top electrode, and along sidewalls of the protection layer adjacent to the third via; a third dielectric layer over a remaining portion of the CMOS wafer; an UBM layer under the metal TSV and a portion of the CMOS wafer; and a coupling layer over the second dielectric layer and the third dielectric layer. Another aspect includes a third dielectric layer over a portion of the CMOS wafer laterally separated from the second dielectric layer; a metal TSV through the CMOS wafer, the first dielectric layer, the piezoelectric layer, and a third portion of the top electrode, respective portions of the second dielectric layer and the third dielectric layer, the third portion on an opposite side of the second portion from the first portion of the top electrode; an UBM layer the metal TSV and a portion of the CMOS wafer; and a coupling layer over the second dielectric layer and the third dielectric layer.

A further aspect of the present disclosure is a device including: a cavity in a portion of a first dielectric layer over a silicon (Si) wafer; a bottom electrode over respective portions of the first dielectric layer and the cavity; a piezoelectric layer over a portion of the cavity and the Si wafer, a gap formed over a remaining portion of the cavity; a top electrode over a portion of the piezoelectric layer; a protection layer over the piezoelectric layer and a portion of the top electrode and along sidewalls of the top electrode; a via through the piezoelectric layer and a portion of the top electrode down to a portion of the bottom electrode laterally separated from the cavity; a metal layer over and along sidewalls of the via, over a portion of the portion of the top electrode, and along sidewalls of the protection layer adjacent to the via; and a second dielectric layer with a first portion and a second portion laterally separated over the Si wafer, cavity, an elastic layer, and passivation formed.

Aspects of the device include a second metal layer over a portion of the Si wafer and under the cavity and a portion of the first dielectric layer; a second via through the piezoelectric layer and the first dielectric layer, a second portion of the top electrode proximate to the portion of the top electrode down to the second metal layer; a third via through the piezoelectric layer, the first dielectric layer, and a third portion of the top electrode down to the second metal layer, the third via on an opposite side of the second via from the first via; and the metal layer over and along sidewalls of the second via and the third via, over respective portions of the second portion of the top electrode and the third portion of the top electrode, wherein the metal layer over the third portion of the top electrode comprises an open pad. Other aspects include a second metal layer over a second portion and a third portion of the top electrode proximate to the portion of the top electrode and along sidewalls of the protection layer, wherein the metal layer over the third portion of the top electrode comprises an open pad.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 12 schematically illustrate cross-sectional views of a process flow for forming a monolithic integrated PMUT and CMOS with a coplanar elastic, sealing, and passivation layer formed in a single step without wafer bonding, in accordance with an exemplary embodiment;

DETAILED DESCRIPTION

Figure 3:
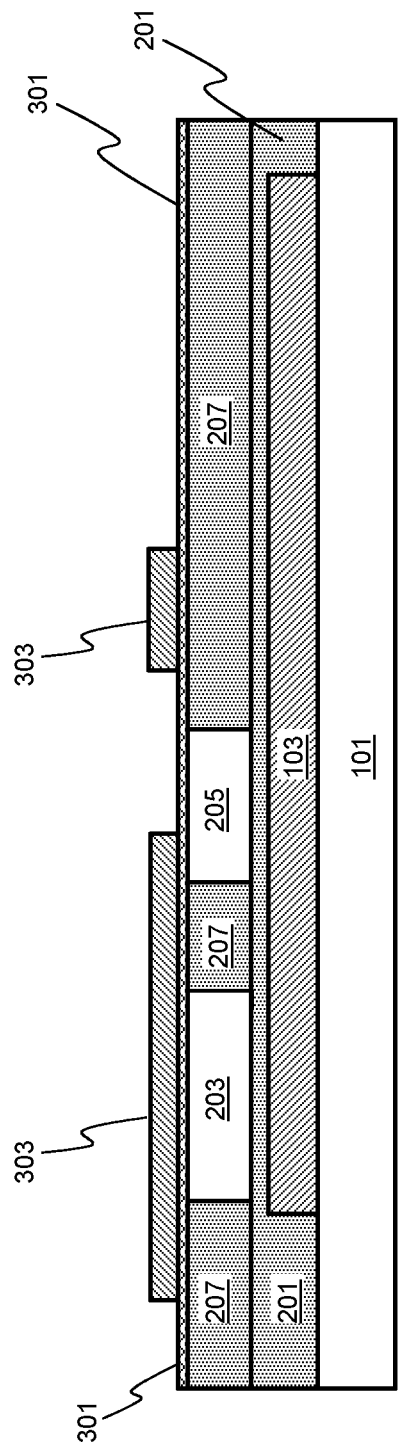
Figure 4:
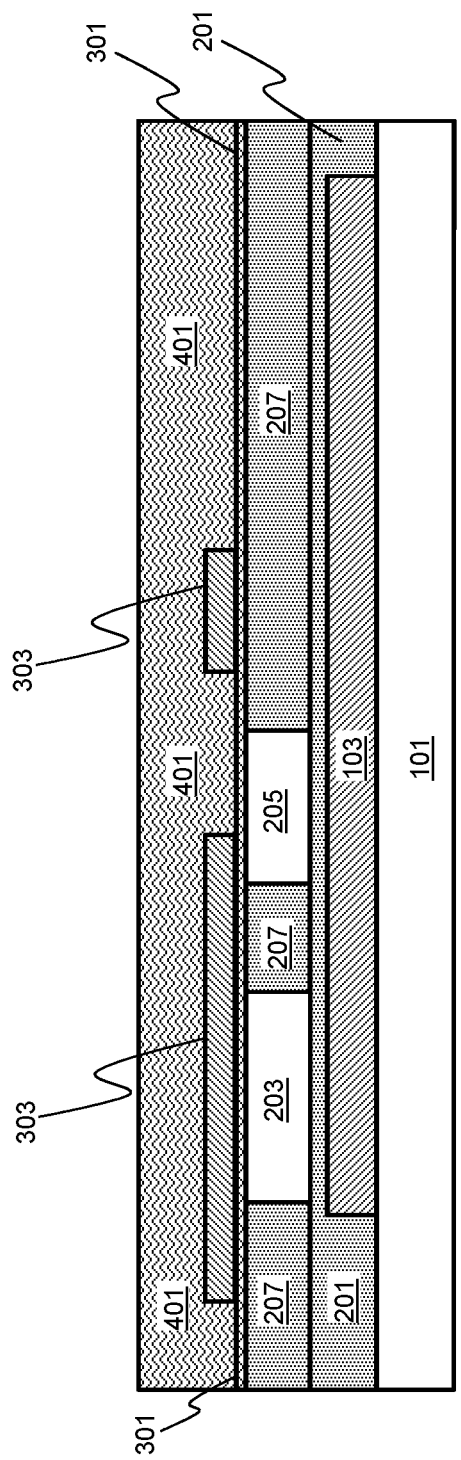

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of additional costs, bonding yield factors such as phase shifting, signal loss, etc., and complex interconnect designs attendant upon known wafer bonding HF PMUT fabrication techniques and complex process flows attendant upon forming the requisite elastic, sealing, and passivation layers according to known monolithic HF-PMUT+IC fabrication techniques. The problems are solved, inter alia, by forming a monolithic integrated PMUT and CMOS with a coplanar elastic, sealing, and passivation layer formed in a single step without wafer bonding Methodology in accordance with embodiments of the present disclosure includes providing a CMOS wafer with a metal layer. A dielectric layer is formed over the CMOS wafer and a sacrificial structure is formed in a portion of the dielectric layer over the metal layer. A bottom electrode is formed over portions of the sacrificial structure and the dielectric layer and a piezoelectric layer is formed over the CMOS wafer. A top electrode is formed over portions of the bottom electrode and the piezoelectric layer. A first via is formed through a first portion of the top electrode down to a portion of the bottom electrode laterally separated from the sacrificial structure and a second via is formed down to the metal layer through a second portion of the top electrode proximate to the first portion. A second metal layer is formed over and along sidewalls of the first via and the second via and over a portion of the first portion and the second portion of the top electrode. The sacrificial structure is removed forming an open cavity and a second dielectric layer is formed over a portion of the CMOS wafer, sealing the open cavity and forming an elastic layer and passivation.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 12 schematically illustrate cross-sectional views of a process flow for forming a monolithic integrated PMUT and CMOS with a coplanar elastic, sealing, and passivation layer formed in a single step without wafer bonding, in accordance with an exemplary embodiment. Referring to FIG. 1, a CMOS wafer 101 is provided with a (last) metal layer 103, e.g., formed of aluminum (Al) or copper (Cu).

Next, a dielectric layer and sacrificial structures are formed using one of two possible process flows. In the first instance, a dielectric layer 201 is formed, e.g., of silicon dioxide ($SiO_2$), silicon nitride (SiN), aluminum nitride (AlN), aluminum oxide ($Al_2O_3$), other suitable dielectrics, or a combination of these materials, over the CMOS wafer 101 and then planarized, e.g., by chemical-mechanical polishing (CMP), as depicted in FIG. 2A. The resultant thickness of the dielectric layer 201 relative to the metal layer 103 may be from 0 micrometer (μm) (the metal layer 103 being exposed) to 5 μm, e.g., 1-2 μm. A sacrificial layer (not shown for illustrative convenience) is then formed, e.g., of amorphous silicon (a-Si), $SiO_2$, tungsten (W), molybdenum (Mo), or other suitable materials, over the dielectric layer 201 and patterned, forming the sacrificial structures 203 and 205. The dimensions and the distance between the sacrificial structures 203 and 205 are based on the final MEMS design, for example, 1 μm to 1000 μm, e.g., 20 μm to 100 μm and 1 μm to 50 μm, respectively. Thereafter, a dielectric layer 207 is formed over the CMOS wafer 101 and planarized, e.g., by CMP, down to the sacrificial structures 203 and 205.

Alternatively, a dielectric layer 201 is formed over the CMOS wafer 101, planarized, e.g., by CMP, and then patterned (not shown for illustrative convenience). Thereafter, a sacrificial layer (not shown for illustrative convenience) is formed over the dielectric layer 201 and planarized, e.g., by CMP, down to the dielectric layer 201, forming the sacrificial structures 203 and 205, as depicted in FIG. 2B.

Referring to FIG. 3, an optional seeding layer 301 is formed, e.g., of AlN, over the CMOS wafer 101 and a metal layer (not shown for illustrative convenience) is formed, e.g., of Mo, W, Al, platinum (Pt), or other suitable material, over the seeding layer 301. The metal layer is then patterned to form the bottom electrode 303. In this instance, FIGS. 3 through 20 are illustrated only following FIG. 2A for the purposes of simplicity; however, it should be understood that the same process steps also follow FIG. 2B. A piezoelectric layer 401 is then formed, e.g., of AlN, lead zirconate titanate (PZT), or polyvinylidene flouride (PVDF) over the CMOS wafer 101 and the type of material used to form the piezoelectric layer 401 often dictates the type of material that can be used for forming the optional seeding layer 301. In this instance, both the optional seeding layer 301 and the piezoelectric layer 401 are formed of AlN.

Figure 5:
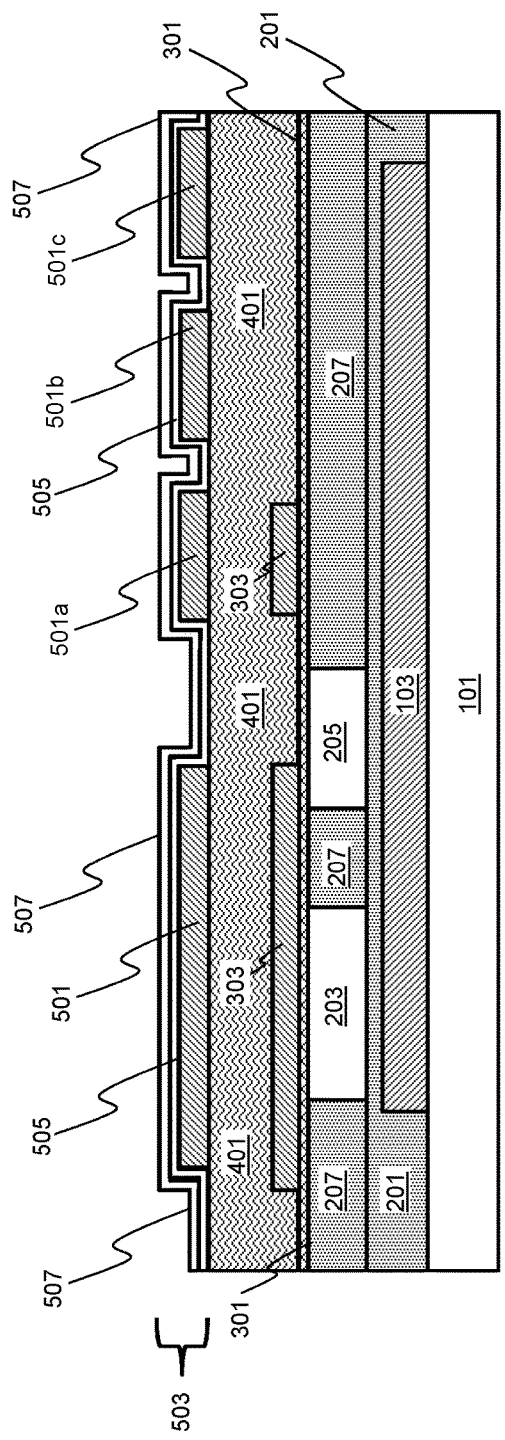

Next, a metal layer (not shown for illustrative convenience) is formed over the piezoelectric layer 401 and then patterned, forming a top electrode including a main portion of the top electrode 501, a first portion of the top electrode 501a, a second portion of the top electrode 501b and a third portion of the top electrode 501c over the bottom electrode 303 and the piezoelectric layer 401, as depicted in FIG. 5. As with the bottom electrode 303, the top electrode 501 may be formed, e.g., of Mo, W, Al, Pt, or other suitable material. A protection layer 503 is then formed, e.g., of an AlN or $Al_2O_3$ layer 505 and an oxide layer 507, over the CMOS wafer 101 and along the sidewalls of the main portion of the top electrode 501, the first portion of the top electrode 501a, the second portion of the top electrode 501b and the third portion of the top electrode 501c.

Figure 6:
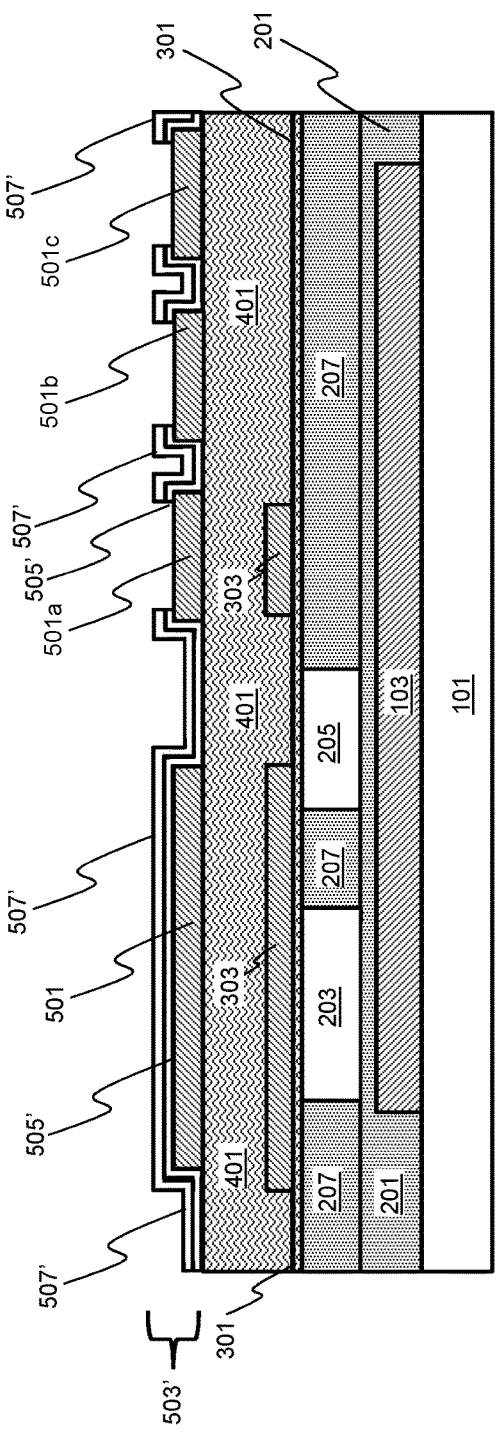

Referring to FIG. 6, portions of the protection layer 503 are removed down to the first portion of the top electrode 501a, the second portion of the top electrode 501b and the third portion of the top electrode 501c for subsequent via formation, forming the protection layer 503', AlN or $Al_2O_3$ layer 505', and oxide layer 507'. Next, bottom electrode vias 701, 703, and 705 are formed in between the openings of the protection layer 503' through the first portion of the top electrode 501a, the second portion of the top electrode 501b and the third portion of the top electrode 501c down to the bottom electrode 303 and the dielectric layer 205, respectively, as depicted in FIG. 7. The vias 703 and 705 are then extended down to the metal layer 103, forming PMUT-ASIC vias 703' and 705', as depicted in FIG. 8.

Figure 9:
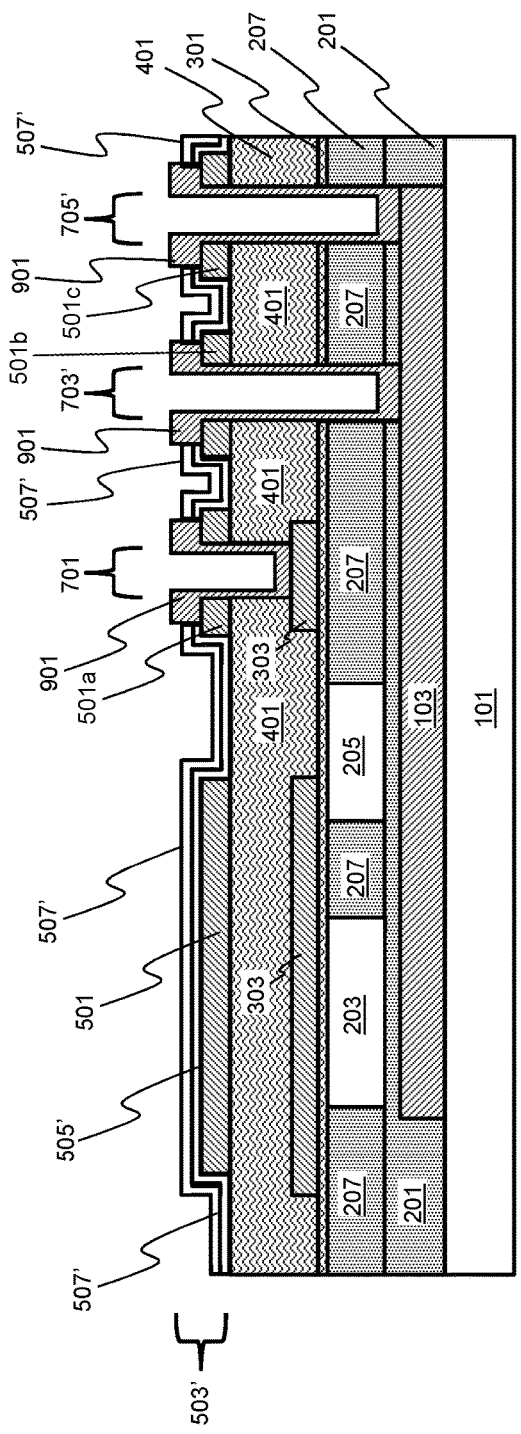
Figure 10:
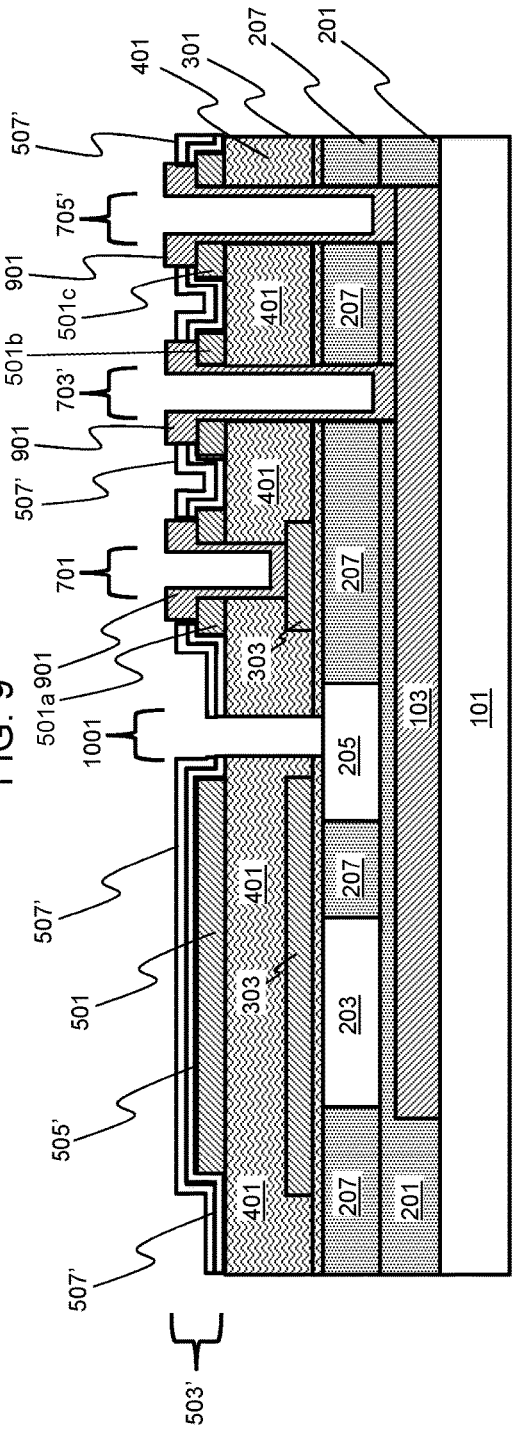
Figure 11:
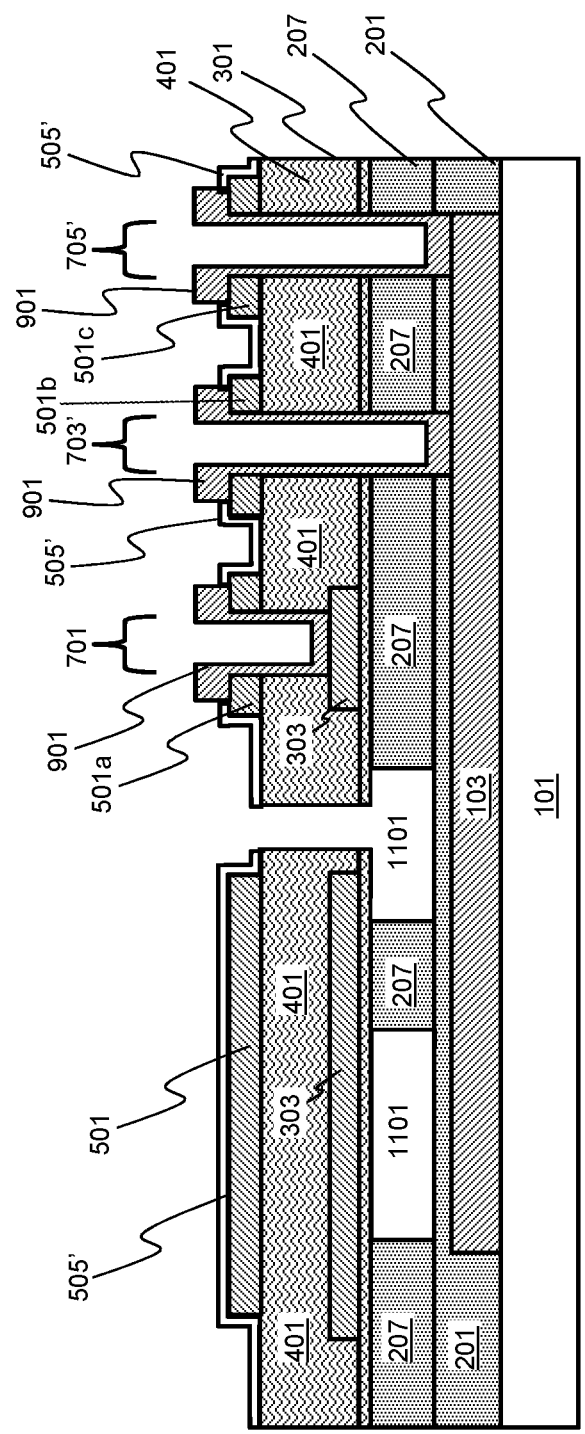

A metal layer 901 is then formed, e.g., of Al, over and along sidewalls of the vias 701, 703', and 705' and over portions of the first portion of the top electrode 501a, the second portion of the top electrode 501b and the third portion of the top electrode 501c adjacent to the vias 701, 703', and 705', as depicted in FIG. 9. Referring to FIG. 10, a release via 1001 is formed through the protection layer 503' and the piezoelectric layer 401 down to the sacrificial structures 205 and 203 (not shown for illustrative convenience). Thereafter, a dry or wet release etch process is performed to remove the sacrificial structures 203 and 205, forming open cavities 1101, as depicted in FIG. 11. In addition, the oxide layer 507' is also removed as a result of the dry or wet release etch process.

Figure 12:
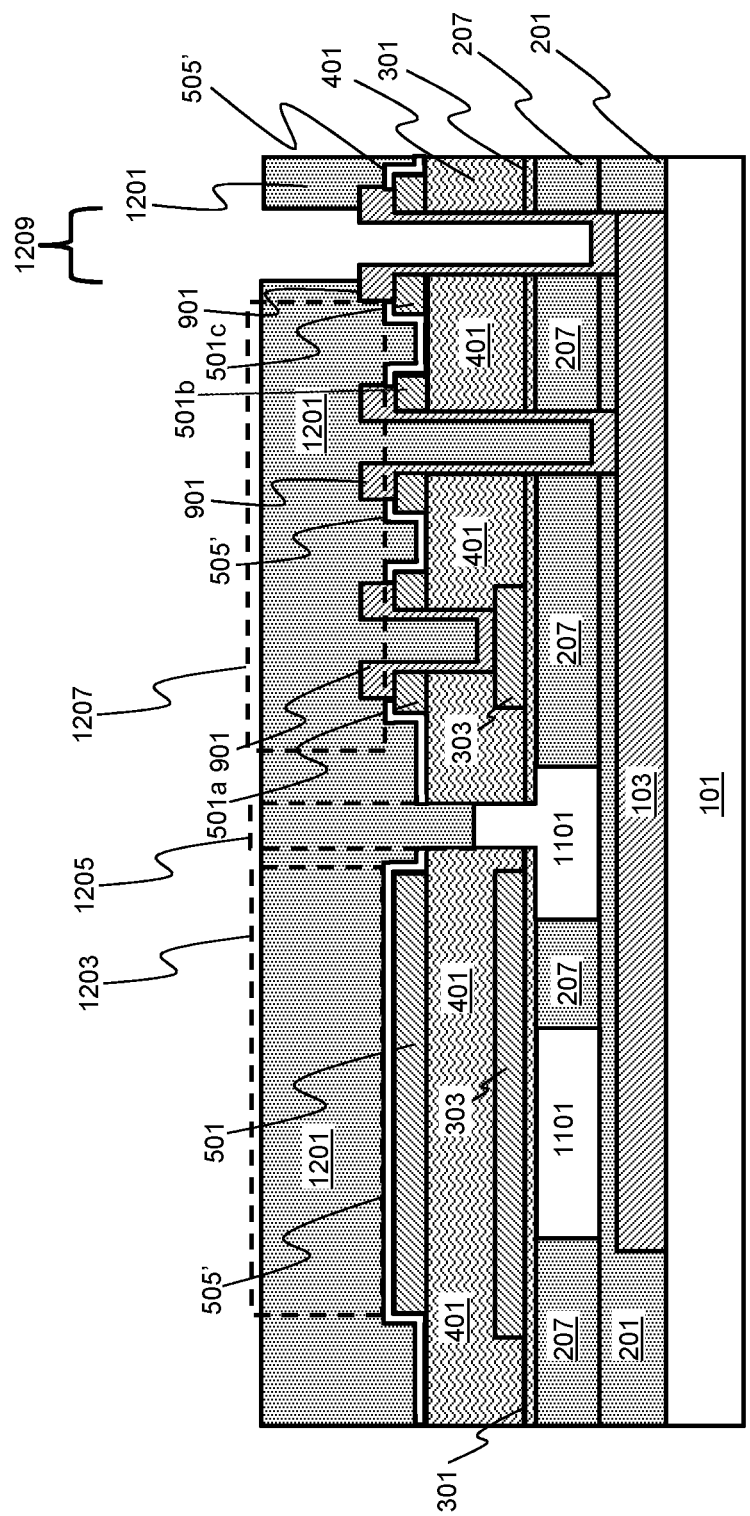

Referring to FIG. 12, a dielectric layer 1201 is formed, e.g., by chemical vapor deposition (CVD) or plasma vapor deposition (PVD), over the CMOS wafer 101, thereby sealing the open cavities 1101 and forming an elastic layer and passivation as highlighted by the boxes 1203, 1205, and 1207, respectively. The dielectric layer 1201 may be formed, e.g., of $SiO_2$, SiN, AlN, $Al_2O_3$, other suitable dielectrics, or a combination of these materials. Thereafter, a trench 1209 may be formed through the dielectric layer 1201, reopening the via 705' of FIG. 8, thereby forming an open pad for subsequent packaging/external interconnects, e.g., wire bonding, (not shown for illustrative convenience).

Figure 13:
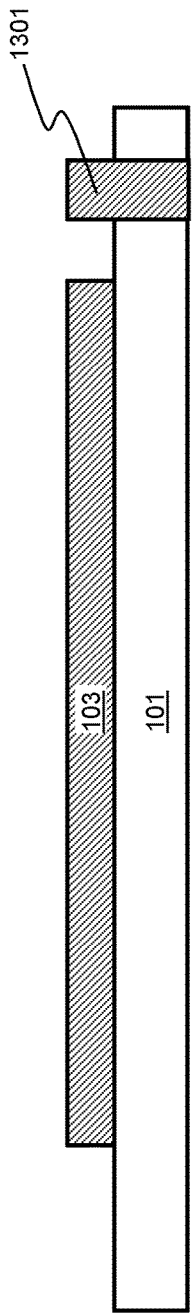
FIGS. 13 through 15 schematically illustrate cross-sectional views of a partial process flow for forming a monolithic integrated PMUT and CMOS with a TSV and with a coplanar elastic, sealing, and passivation layer formed in a single step without wafer bonding, in accordance with an exemplary embodiment.
Figure 14:
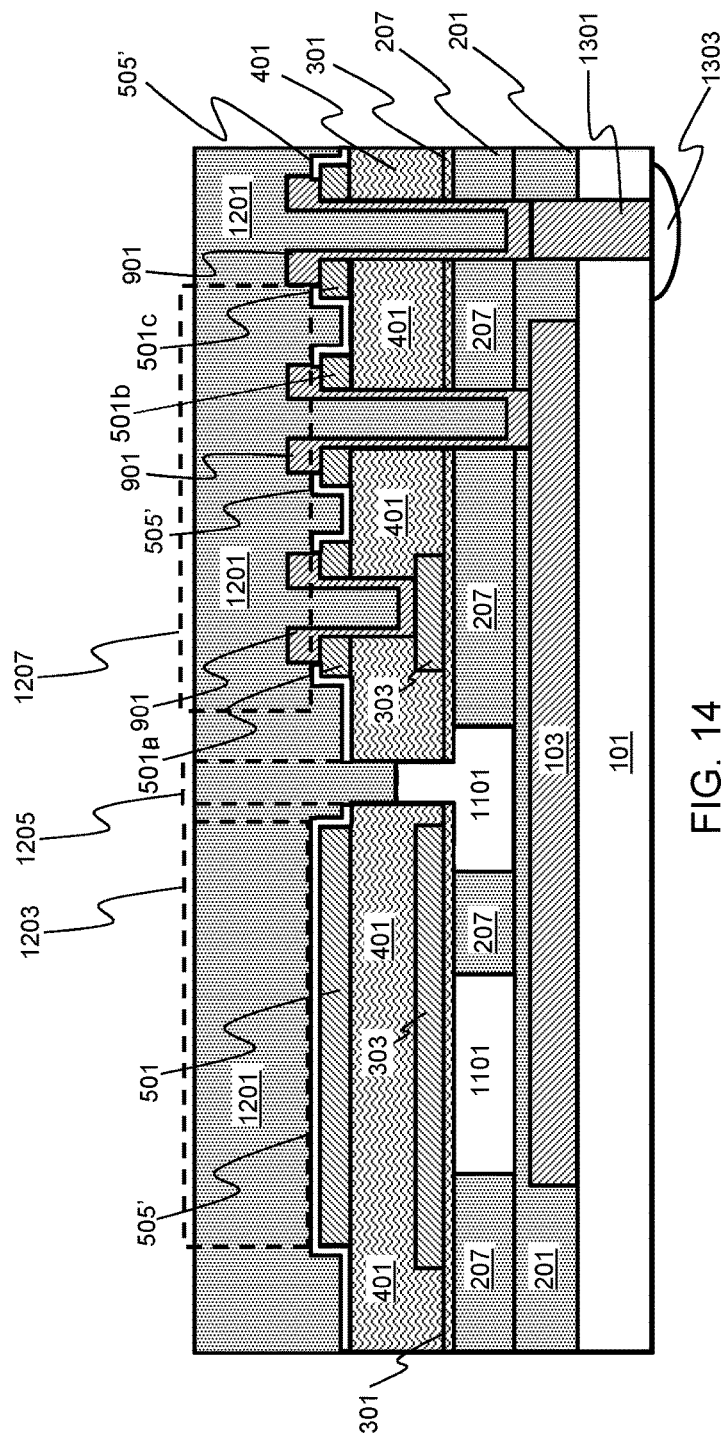
Figure 15:
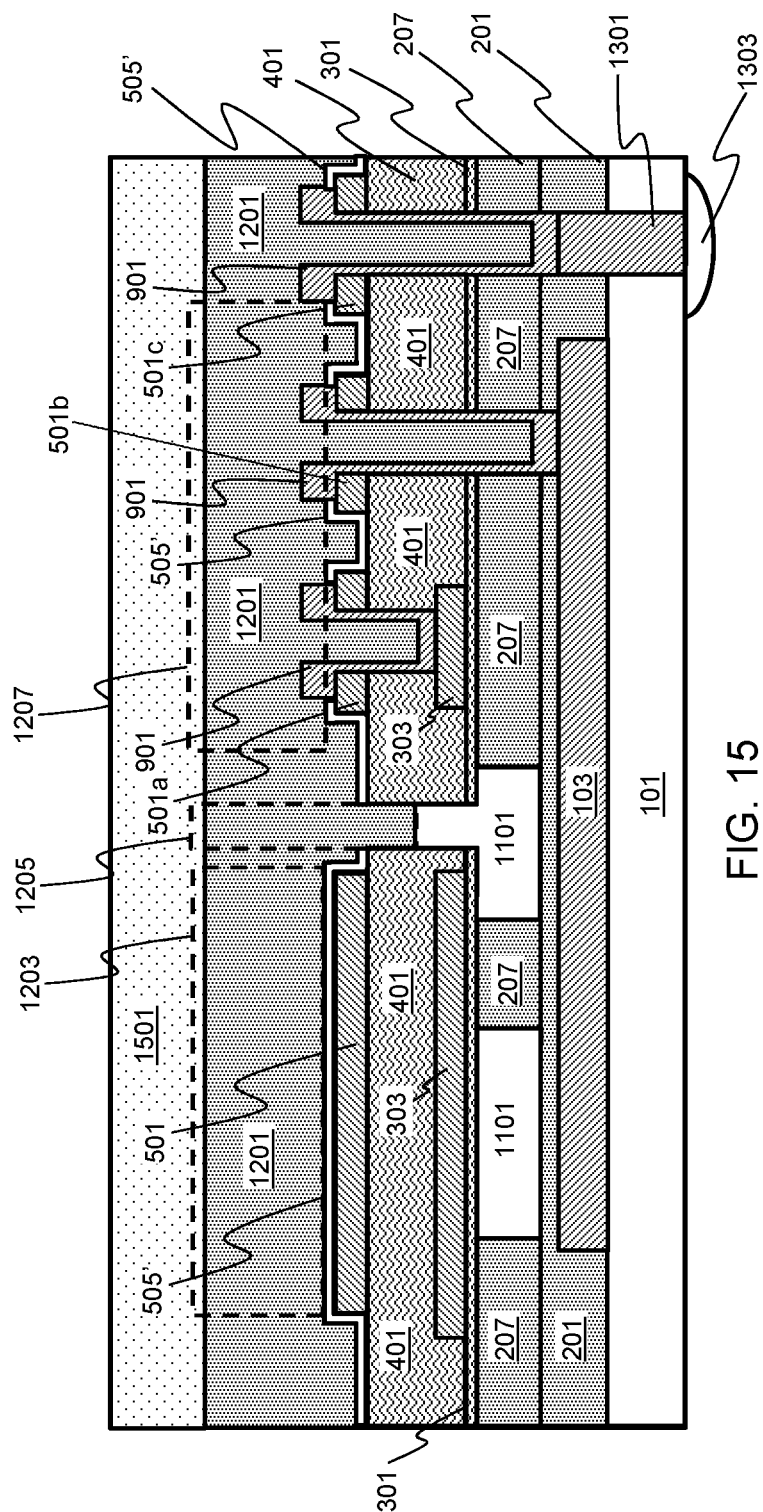

FIGS. 13 through 15 schematically illustrate cross-sectional views of a partial process flow for forming a monolithic integrated PMUT and CMOS with a TSV and with a coplanar elastic, sealing, and passivation layer formed in a single step without wafer bonding, in accordance with an exemplary embodiment. Referring to FIG. 13, the CMOS wafer 101 of FIG. 1 is again provided with a (last) metal layer 103, e.g., formed of Al or Cu; however, in this instance, the CMOS wafer 101 is also provided with a TSV 1301 formed, e.g., of Al or Cu, laterally separated from the metal layer 103. The process steps of FIGS. 2 through 12 are then largely repeated, as depicted in the resultant device of FIG. 14, except that in this instance, the via 705' of FIG. 8 is extended down to the TSV 1301 instead of the metal layer 103, the trench 1209 is not formed in the dielectric layer 1201, and a UMB 1303 is formed under the TSV 1301 and a portion of the CMOS wafer 101. Referring to FIG. 15, a coupling layer 1501 may be formed, e.g., of polymer, over the dielectric layer 1201 so that the device may be subsequently attached to other surfaces, e.g., glass, (not shown for illustrative convenience).

Figure 16:
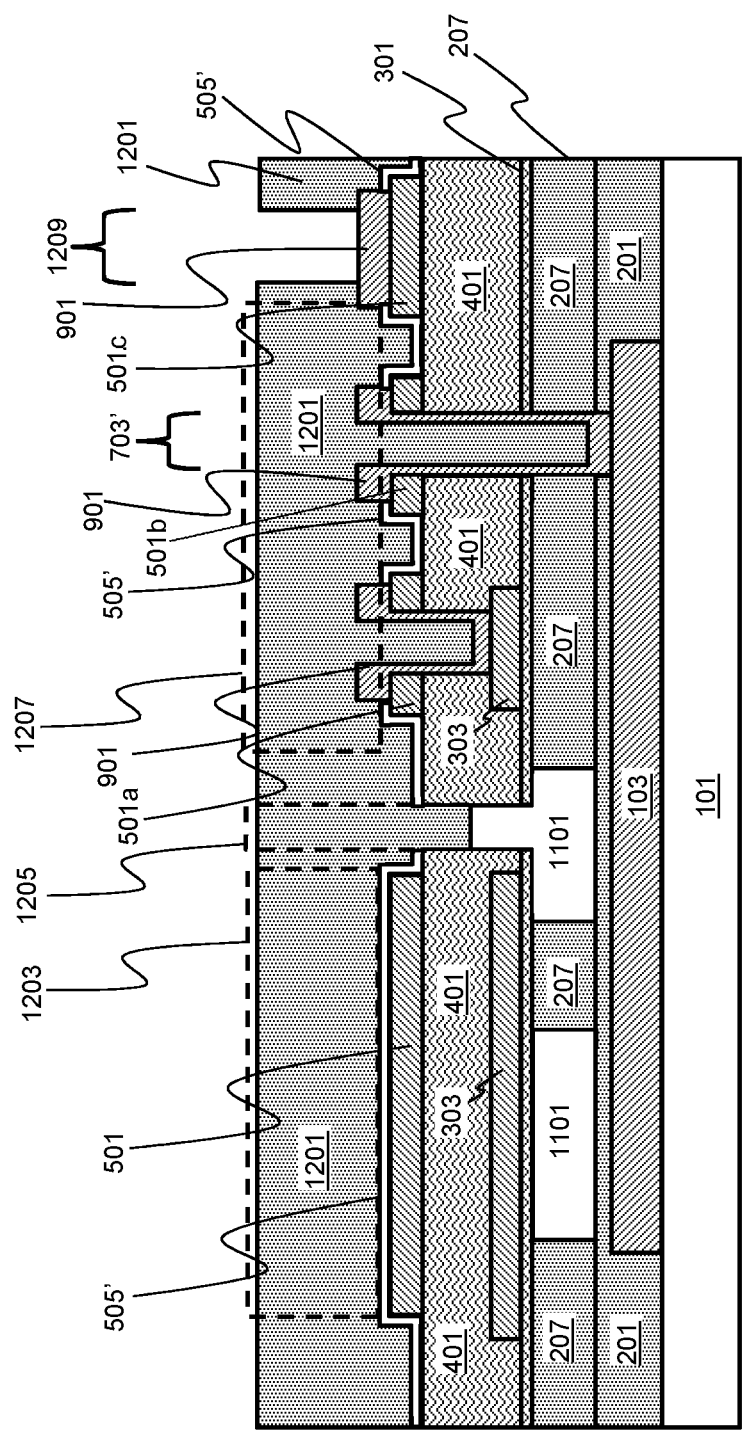
FIGS. 16 through 18 schematically illustrate cross-sectional views of a partial process flow for forming a monolithic integrated PMUT and CMOS with a TSV and with a coplanar elastic, sealing, and passivation layer formed in a single step without wafer bonding, in accordance with another exemplary embodiment.
Figure 17:
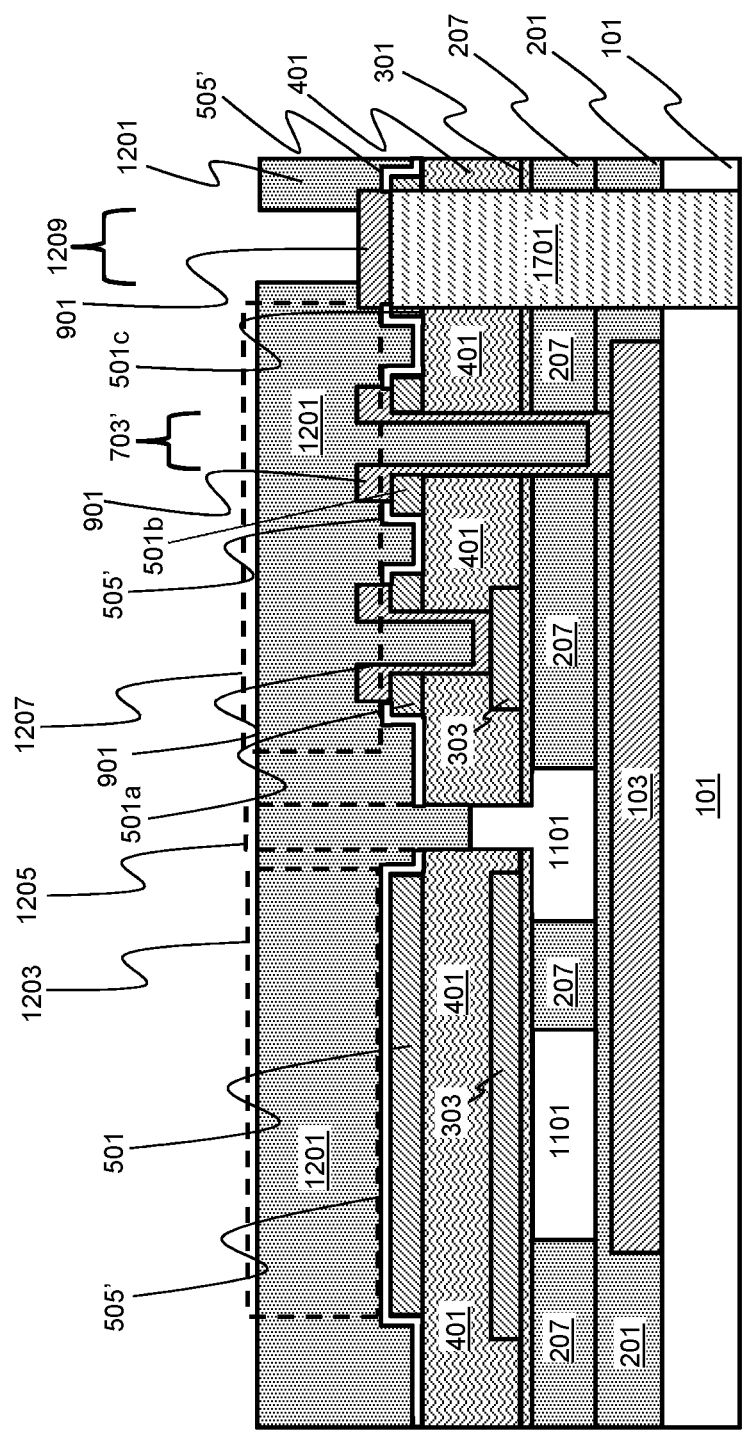
Figure 18:
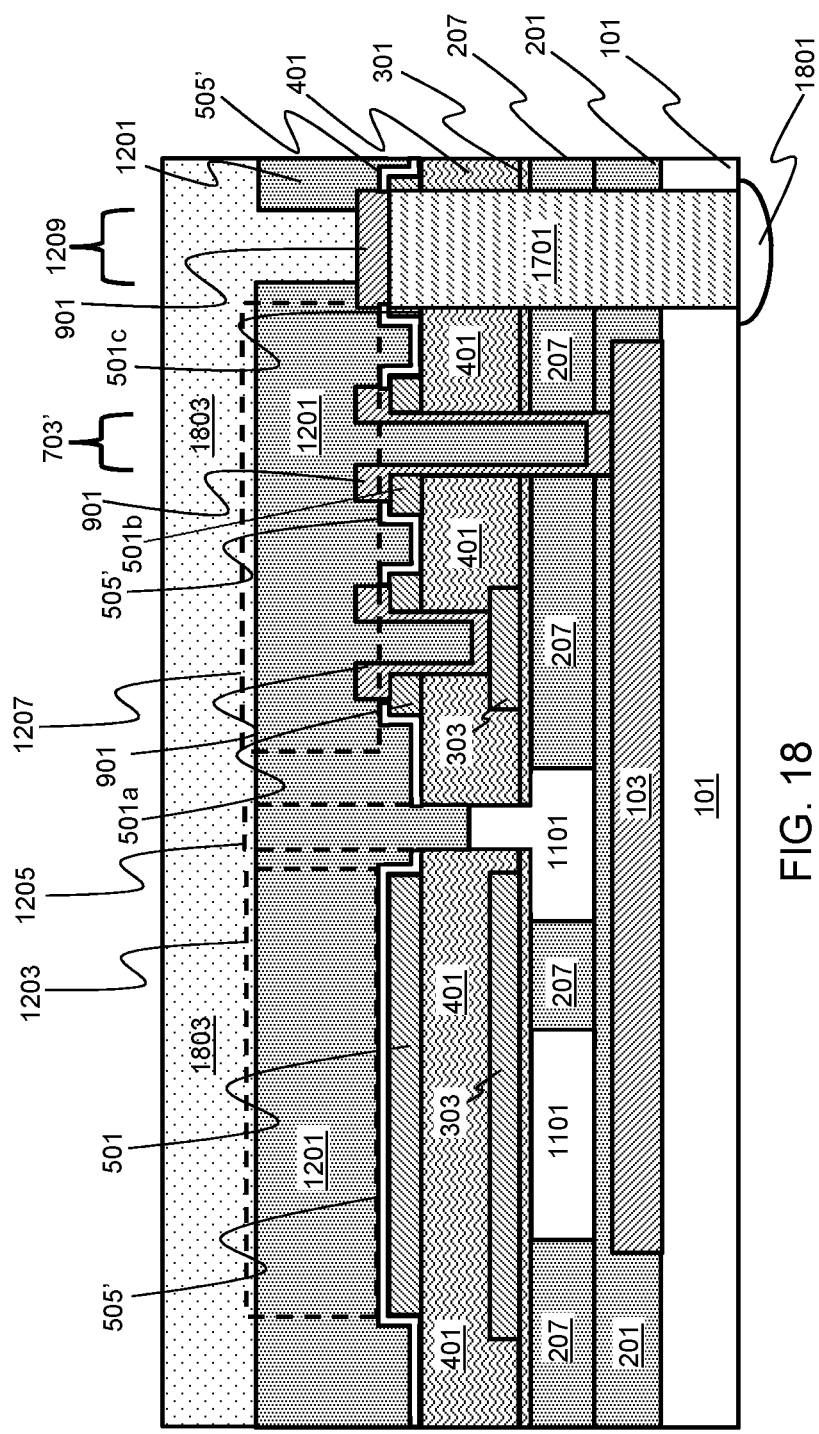

FIGS. 16 through 18 schematically illustrate cross-sectional views of a partial process flow for forming a monolithic integrated PMUT and CMOS with a TSV and a coplanar elastic, sealing, and passivation layer formed in a single step without wafer bonding, in accordance with another exemplary embodiment. Referring to FIG. 16, the CMOS wafer 101 of FIG. 1 is again provided with a (last) metal layer 103, e.g., formed of Al or Cu, and the process steps of FIGS. 2 through 12 are again largely repeated; however, in this instance, rather than forming the metal layer 901 over and along the sidewalls of the via 705', the metal layer 901 is formed over the second portion of the top electrode 501b and the third portion of the top electrode 501c adjacent to the via 703' and the trench 1209 is formed through the dielectric layer 1201 over the metal layer 901. Referring to FIG. 17, a TSV 1701 is then formed through the CMOS wafer 101, the dielectric layers 201 and 207, the optional seeding layer 301, the piezoelectric layer 401, and the third portion of the top electrode 501c up to the metal layer 901. Thereafter, a UMB 1801 is formed under the TSV 1701 and a portion of the CMOS wafer 101 and a coupling layer 1803 may be formed, e.g., of polymer, over the dielectric layer 1201, filling the trench 1209, as depicted in FIG. 18.

Figure 19:
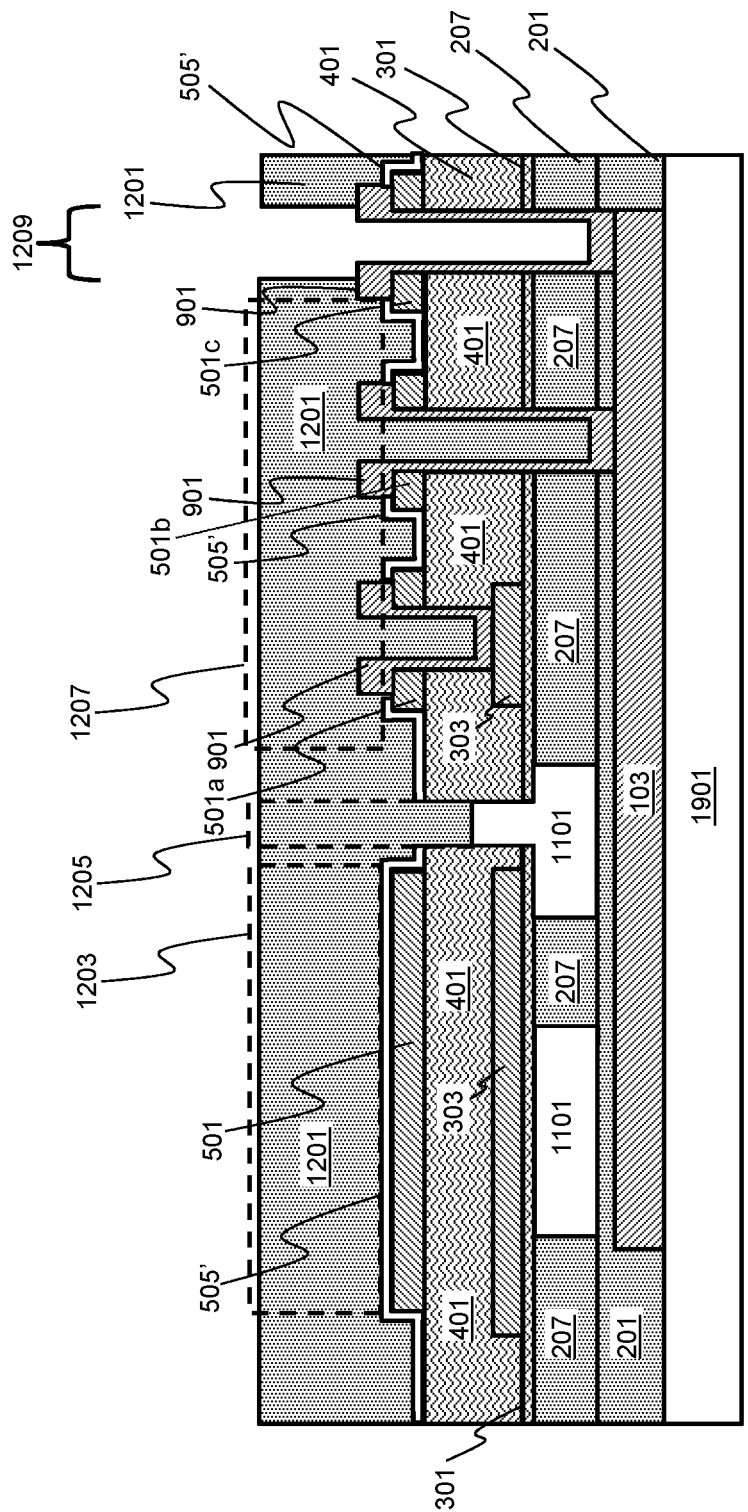
FIGS. 19 and 20 schematically illustrate cross-sectional views of a resultant monolithic stand-alone PMUT with a coplanar elastic, sealing, and passivation layer formed in a single step without wafer bonding, in accordance with an exemplary embodiment.
Figure 20:
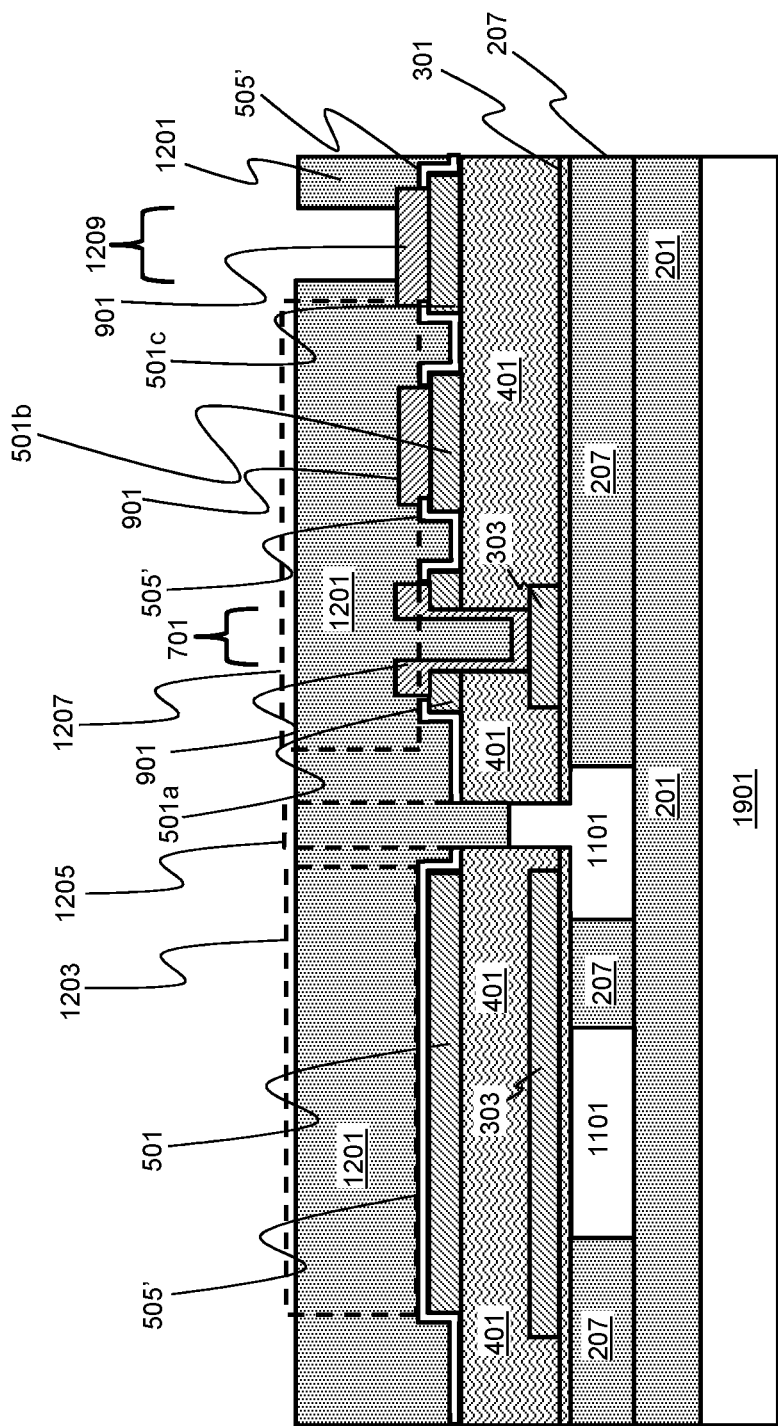

FIGS. 19 and 20 schematically illustrate cross-sectional views of a resultant monolithic stand-alone PMUT with a coplanar elastic, sealing, and passivation layer formed in a single step without wafer bonding, in accordance with an exemplary embodiment. The process flow for forming the resultant device of FIG. 19 is almost identical to the process flow of FIGS. 1 through 12, except that in this instance, the metal layer 103 is formed over a Si wafer 1901 instead of the CMOS wafer 101. Similarly, the process flow for forming the resultant device of FIG. 20 is almost identical to the process flow of FIGS. 1 through 16; however, in this instance, the dielectric layer 201 is formed over a Si wafer 2001 without a metal layer, and rather than forming the metal layer 901 over and along the sidewalls of the vias 703' and 705' of FIG. 8, the metal layer 901 is formed over the second portion of the top electrode 501b and the third portion of the top electrode 501c adjacent to the via 701.

The embodiments of the present disclosure can achieve several technical effects such as removing potential application concerns commonly associated with the bonding integration process, e.g., phase shifting, signal loss, etc., due to the monolithic integration of PMUT and CMOS and providing a simpler and reduced-cost flow relative to known HF PMUT and HF-PMUT+IC process flows due to sealing the cavity and forming the elastic layer and passivation in the same step without wafer bonding. In addition, the distance between the cavities may be reduced relative to known devices, e.g., >10 μm to approximately 1 μm, because there is no need for bonding stand-off. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including PMUT and CMOS and stand-alone PMUT.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a first metal layer over a complimentary metal-oxide-semiconductor (CMOS) wafer;
a first dielectric layer over the CMOS wafer;
a cavity in the first dielectric layer over the first metal layer;
a bottom electrode over the first dielectric layer and the cavity;
a piezoelectric layer over a portion of the cavity and the CMOS wafer, a gap formed over a remaining portion of the cavity;
a top electrode over the piezoelectric layer;
a protection layer over the piezoelectric layer and the top electrode and along sidewalls of the top electrode;
a first via through the piezoelectric layer and a first portion of the top electrode down to a portion of the bottom electrode laterally separated from the cavity;
a second via through the piezoelectric layer, the first dielectric layer, and a second portion of the top electrode proximate to the first portion of the top electrode down to the first metal layer;
a second metal layer over and along sidewalls of the first via and the second via, over the first portion of the top electrode and the second portion of the top electrode, and along sidewalls of the protection layer adjacent to the first via and the second via; and
a second dielectric layer over the CMOS and the cavity, wherein various portions of the second dielectric layer respectively form an elastic layer and a passivation.

2. The device according to claim 1, further comprising:
a seeding layer over the cavity and the CMOS wafer, the seeding layer formed over the first dielectric layer and the cavity and under the bottom electrode and the piezoelectric layer.

3. The device according to claim 1, further comprising:
a third via through the piezoelectric layer, the first dielectric layer, and a third portion of the top electrode, down to the first metal layer, the third via on an opposite side of the second via from the first via; and
the second metal layer over and along sidewalls of the third via, over the third portion of the top electrode, and along sidewalls of the protection layer adjacent to the third via;
wherein the second via and third via comprise piezoelectric micromachined ultrasonic transducer (PMUT)-application specific integrated circuit (ASIC) electrode vias.

4. The device according to claim 1, further comprising:
a metal through silicon via (TSV) through the CMOS wafer, the metal TSV laterally separated from the first metal layer;
a third via through the piezoelectric layer, the first dielectric layer, and a third portion of the top electrode down to the metal TSV, the third via on an opposite side of the second via from the first via;
the second metal layer over and along sidewalls of the third via, over the third portion of the top electrode, and along sidewalls of the protection layer adjacent to the third via;
an under bump metallization (UBM) layer under the metal TSV and the CMOS wafer; and
a coupling layer over the second dielectric layer.

5. The device according to claim 1, further comprising:
a metal through silicon via (TSV) through the CMOS wafer, the first dielectric layer, the piezoelectric layer, and a third portion of the top electrode, the second dielectric layer, the third portion of the top electrode on an opposite side of the second portion of the top electrode from the first portion of the top electrode;
an under bump metallization (UBM) layer the metal TSV and the CMOS wafer; and
a coupling layer over the second dielectric layer.

6. A device comprising:
a cavity in a first dielectric layer over a silicon (Si) wafer;
a bottom electrode over the first dielectric layer and the cavity;
a piezoelectric layer over the cavity and the Si wafer, a gap formed over a remaining portion of the cavity;
a top electrode over the piezoelectric layer;
a protection layer over the piezoelectric layer and the top electrode and along sidewalls of the top electrode;
a via through the piezoelectric layer and a first portion of the top electrode down to a portion of the bottom electrode laterally separated from the cavity;
a first metal layer over and along sidewalls of the via, over the first portion of the top electrode, and along sidewalls of the protection layer adjacent to the via; and
a second dielectric layer over the Si wafer and the cavity, wherein a first portion and a second portion of the second dielectric layer respectively form an elastic layer and passivation.

7. The device according to claim 6, further comprising:
a second metal layer over the Si wafer and under the cavity and the first dielectric layer;
a second via through the piezoelectric layer and the first dielectric layer, a second portion of the top electrode proximate to the first portion of the top electrode down to the second metal layer;
a third via through the piezoelectric layer, the first dielectric layer, and a third portion of the top electrode down to the second metal layer, the third via on an opposite side of the second via from the first via; and
the first metal layer over and along sidewalls of the second via and the third via, over the second portion of the top electrode and the third portion of the top electrode,
wherein the first metal layer over the third portion of the top electrode comprises an open pad.

8. The device according to claim 6, further comprising:
a second metal layer over a second portion of the top electrode and a third portion of the top electrode proximate to the first portion of the top electrode and along sidewalls of the protection layer,
wherein the second metal layer over the third portion of the top electrode comprises an open pad.

* * * * *